(12) United States Patent  
Sun et al.

(10) Patent No.: US 8,275,086 B2  
(45) Date of Patent: *Sep. 25, 2012

(54) FREQUENCY SYNCHRONIZATION APPARATUS

(75) Inventors: Wei-Nan Sun, Kao Hsiung (TW); Ho-Chi Huang, Hsin Chu Hsien (TW)

(73) Assignee: Mediatek Incorporation, Hsin-Chu (TW)

( * ) Notice: Subject to any disclaimer, the term of this patent is extended or adjusted under 35 U.S.C. 154(b) by 358 days.

This patent is subject to a terminal disclaimer.

(21) Appl. No.: 12/580,724

(22) Filed: Oct. 16, 2009

(65) Prior Publication Data

US 2010/0034331 A1 Feb. 11, 2010

Related U.S. Application Data

(63) Continuation of application No. 11/188,643, filed on Jul. 26, 2005, now Pat. No. 7,627,068.

(30) Foreign Application Priority Data

Jul. 27, 2004 (TW) .............................. 93122454 A

(51) Int. Cl.  
*H04L 7/04* (2006.01)

(52) U.S. Cl. ........ 375/362; 375/260; 375/262; 375/316; 375/365; 375/368

(58) Field of Classification Search .................. 375/260, 375/267, 271, 293, 299, 316, 342–346, 349, 375/354–355, 359, 362, 365, 367, 371  
See application file for complete search history.

(56) References Cited

U.S. PATENT DOCUMENTS

| | | | |
|---|---|---|---|
| 5,241,688 A | 8/1993 | Arora | |
| 6,356,608 B1 | 3/2002 | Atarius | |
| 6,522,686 B1 * | 2/2003 | Ogami | 375/149 |
| 7,480,234 B1 * | 1/2009 | Hart et al. | 370/208 |
| 7,822,005 B2 * | 10/2010 | Ptasinski et al. | 370/338 |
| 2002/0051487 A1 | 5/2002 | Yamada et al. | |
| 2002/0064214 A1 * | 5/2002 | Hattori et al. | 375/150 |
| 2004/0014480 A1 * | 1/2004 | Liu et al. | 455/502 |
| 2004/0161046 A1 | 8/2004 | Schott et al. | |
| 2005/0079826 A1 | 4/2005 | He | |
| 2006/0233225 A1 * | 10/2006 | Omoto | 375/149 |
| 2007/0133386 A1 | 6/2007 | Kim et al. | |
| 2007/0230403 A1 * | 10/2007 | Douglas et al. | 370/334 |

* cited by examiner

Primary Examiner — Hirdepal Singh  
(74) Attorney, Agent, or Firm — Birch, Stewart, Kolasch & Birch, LLP

(57) ABSTRACT

An apparatus for frequency synchronization is proposed to detect a synchronization signal from the baseband signals. It is featured that three types of detection values are introduced to detect whether the synchronization signal is received or not. More particularly, the claimed frequency synchronization apparatus provides at least one signal power generator for receiving a predetermined number of symbols of the baseband signals, and further calculating an average quality value therefore. Further, the apparatus includes a signal selector for producing a first detection value according to the average quality value. Still further, the apparatus provides a decision unit to produce a second detection value. After that, a signal processor inside the decision unit is used to calculate a third detection value as combining the first detection value and the second detection. Consequently, the decision unit particularly decides whether the synchronization signal is received or not in reference with the third detection value.

20 Claims, 12 Drawing Sheets

FREQUENCY SYNCHRONIZATION APPARATUS

CROSS REFERENCE TO RELATED APPLICATION

This application is a Continuation of co-pending application Ser. No. 11/188,643, filed on Jul. 26, 2005, the entire contents of which are hereby incorporated by reference and for which priority is claimed under 35 U.S.C. §120. This nonprovisional application also claims priority under 35 U.S.C. §119(a) on Patent Application No. 093122454 filed in Taiwan on Jul. 27, 2004, the entirety of which is herein incorporated by reference.

BACKGROUND OF THE INVENTION

1. Field of the Invention

The present invention is related to a frequency synchronization apparatus, and more particularly, to an apparatus that is used to detecting whether a synchronization signal is received or not based on the baseband signals.

2. Description of Related Art

Conventionally, in a wireless communication system with a pilot channel, a mobile station must use the pilot channel to synchronize with the base station so as to establish a connection for data transfer. In time division multiple access (TDMA) systems, such as GSM system, a frequency correction channel (FCCH) is used for mobile stations to perform time and frequency synchronization. When the mobile stations are activated or performing a handoff process, they must use the FCCH to perform time and frequency synchronization. Only after the synchronization is performed can the mobile station establish a connection to the base station for data transfer.

Since the FCCH appears rapidly in data slots, the mobile station needs to detect the existence of FCCH to keep or establish the connection to the base station during a practical operation, especially during data transmission over a bad wireless channel, for example, which suffers from severe noise interference or has a frequency offset.

Reference is made to FIG. 1, which is a block diagram of a conventional frequency synchronization apparatus. The frequency synchronization apparatus includes a normalizer 100, a frequency shifter 110, a low-pass filter 120, a phase measuring circuit 130, a phase differentiator 140, a sum/dump device 150, a frequency offset estimation circuit 160 and a quality factor estimation circuit 170.

Therein, the normalizer 100 is used to normalize the received signals to restrict them within a predefined range. The normalizer 100 can be realized by using a lookup table. After normalization, the frequency shifter 110 moves the central frequency of the received signals to the baseband.

After filtering out a noise portion via the low-pass filter 120, the phase measuring circuit 130 extracts the phases of the received signals. After that, the phase differentiator 140 compares the phases of the signals to obtain phase offsets between the signals. After adding up the phase offsets via the sum/dump device 150, the frequency offset estimation circuit 160 uses the summation result to estimate the frequency offset. Then, the quality factor estimation circuit 170 uses the frequency offset to estimate a quality factor to determine whether the frequency offset is correct or not.

However, since the normalizer 100 of the conventional frequency synchronization apparatus is implemented by using a lookup table, the conventional frequency synchronization apparatus must have a memory with a great capacity to store the lookup table. Hence, this kind of conventional frequency synchronization apparatus is very expensive and impractical.

Reference is made to FIG. 2, which is a flow chart for illustrating the operation of another conventional frequency synchronization apparatus. As shown in the figure, the frequency synchronization apparatus first uses the first adaptive band-pass filter to filter the baseband signal Xn to produce the signal Yn (S201). The frequency synchronization apparatus can adjust the poles of the second adaptive band-pass filter via reference to the signal Yn (S202). Thereby, the frequency synchronization apparatus can make the second adaptive band-pass filter have a central frequency that is the same as the reference frequency provided by the FCCH. In addition, the frequency synchronization apparatus can also adjust the gain via reference to the signal Yn (S203-S205). Then, the frequency synchronization apparatus determines whether the frequency correction burst is received or not (S206) and updates the timer (S207).

Furthermore, the baseband signal Xn is first stored in the signal register (S208). After finishing adjusting the second adaptive band-pass filter, the frequency synchronization apparatus uses the second adaptive band-pass filter to filter the baseband signal Xn (S210). After that, the frequency synchronization apparatus uses the frequency offset estimation circuit to obtain the frequency offset (S209). Thereby, this kind of frequency synchronization apparatus can completely abstract the frequency signal provided by the FCCH to estimate the frequency offset of the system.

However, since this frequency synchronization apparatus uses adaptive filters to process the received signals to estimate the frequency offset and perform time-slot alignment, it causes some potential problems. For example, adjusting the parameters of the adaptive filter causes a time delay. Moreover, during adjustment of the adaptive filter, the values of the parameters may exceed a limit and make the frequency synchronization apparatus no longer able to detect the FCCH.

SUMMARY OF THE INVENTION

One of the objectives of the present invention is to provide an apparatus for frequency synchronization, and thereby to detect a synchronization signal from a plurality of baseband signals.

Some further objectives of the frequency synchronization apparatus of the present invention are to obtain the pilot tones and evaluate the frequency and time offset, able to perform the normalization process without using any additional lookup table. More, the frequency synchronization apparatus needs not dynamically adjust the pre-filters as the location or input signals is changed. Therefore, the present invention can eliminate the problems of time delay or missing signal.

For reaching the objectives above, the present invention provides a frequency synchronization apparatus, which is used to detect a frequency correction burst. The claimed frequency synchronization apparatus includes at least one signal power generator for receiving a predetermined number of symbols of the baseband signals, and for calculating an average quality value of the received symbols. The apparatus further has a signal selector for producing a first detection value according to the average quality value. Still further, the apparatus includes a decision unit having a signal processor for producing a second detection value through a predetermined mathematical function. Particularly, the signal processor is used to calculate a third detection value by combining the first detection value and the second detection value. The detection value can be described as:

$$R_n = \lambda \cdot Q_n + (1-\lambda) \cdot P_n$$

Therefore, the decision unit can acknowledge that the synchronization signal is received according to the third detection value.

Numerous additional features, benefits and details of the present invention are described in the detailed description, which follows.

BRIEF DESCRIPTION OF THE DRAWINGS

The foregoing aspects and many of the attendant advantages of this invention will be more readily appreciated as the same becomes better understood by reference to the following detailed description, when taken in conjunction with the accompanying drawings, wherein.

DETAILED DESCRIPTION OF THE PREFERRED EMBODIMENTS

Figure 1:
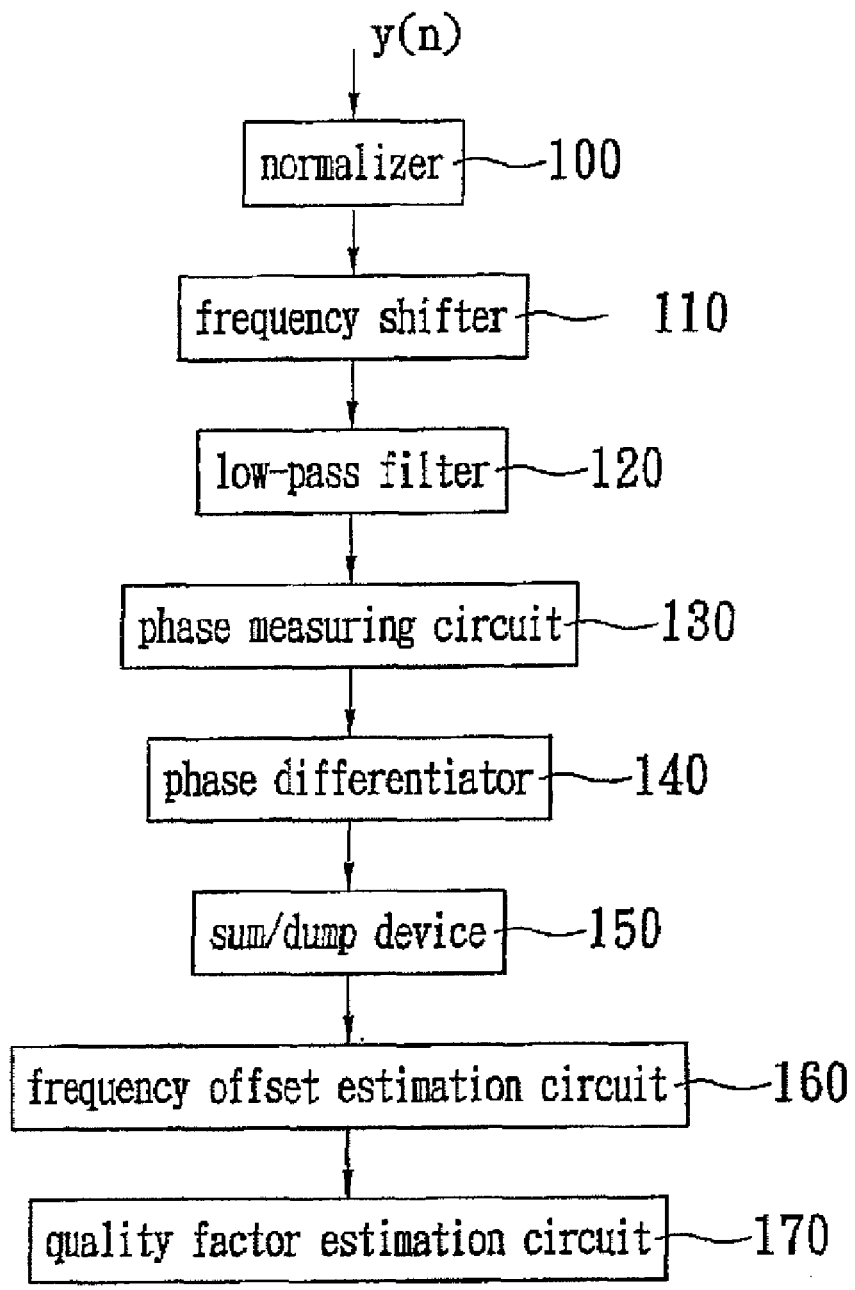
FIG. 1 is a block diagram of a conventional frequency synchronization apparatus.
Figure 2:
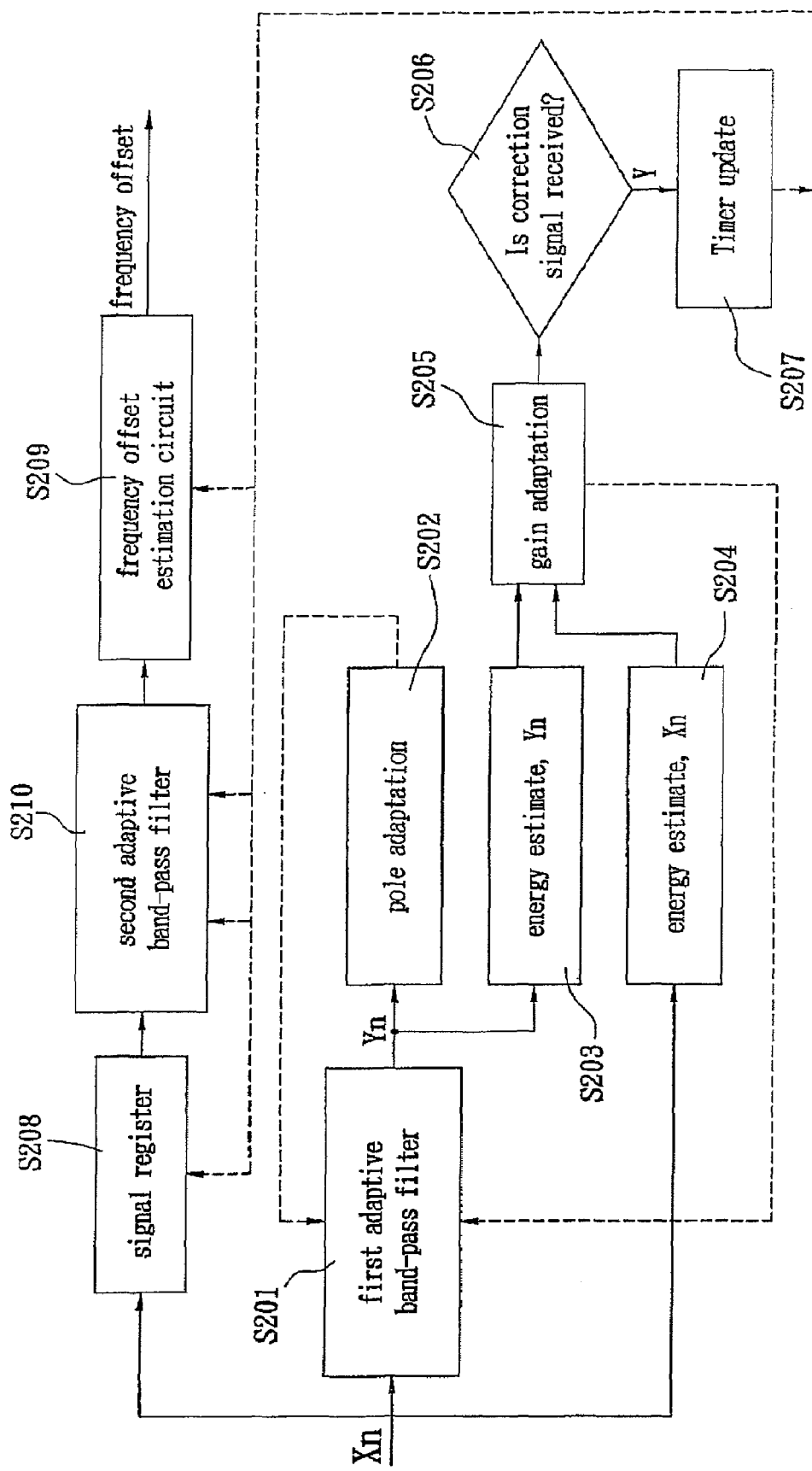
FIG. 2 is a flow chart for illustrating the operation of another conventional frequency synchronization apparatus.
Figure 3A:
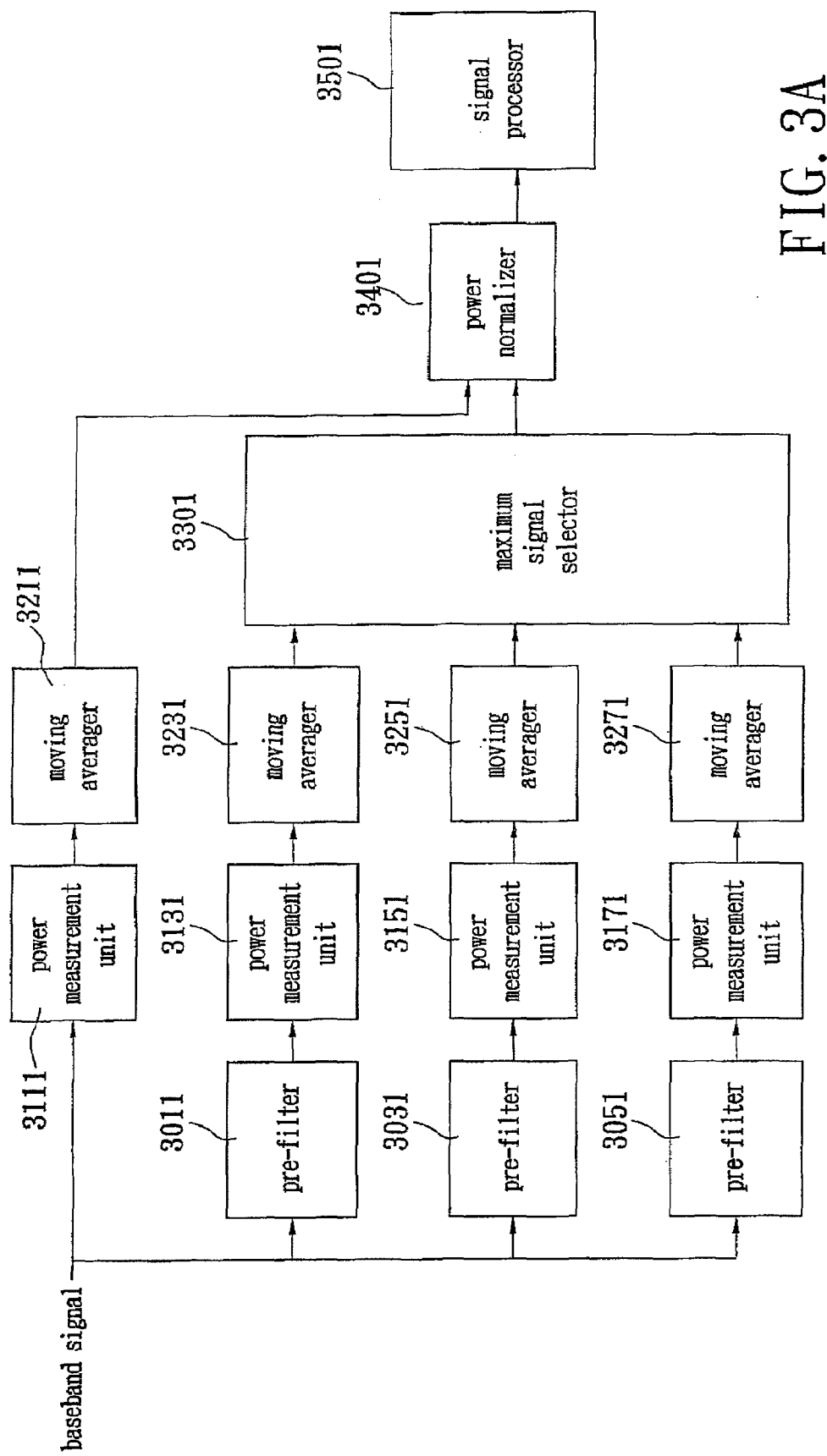
FIGS. 3A-C are block diagrams of the preferred embodiments of the frequency synchronization apparatus in accordance with the present invention.

Reference is made to FIG. 3A, which is a block diagram of the first embodiment of a frequency synchronization apparatus in accordance with the present invention. As shown in the figure, the present invention includes pre-filters 3011, 3031, 3051, power measurement units 3111, 3131, 3151, 3171, moving averagers 3211, 3231, 3251, 3271, a maximum signal selector 3301, a power normalizer 3401 and a signal processor 3501.

In practice, the present invention can have multiple signal power generators (each one has a pre-filter, a power measurement unit and a moving averager), and the number of the generators is unlimited. In the present invention, more signal power generators result in more exact the estimated frequency offset. Furthermore, in the present invention, the input signals of the frequency synchronization apparatus is obtained by sampling the baseband signal, which is formed by demodulating the signal received from the FCCH.

First, the frequency synchronization apparatus of the present invention uses the pre-filters 3011, 3031 and 3051 to filter the input signals. Then, the frequency synchronization apparatus uses the power measurement units 3131, 3151 and 3171 to measure the power of the signals presenting ht signal quality output from the pre-filters, respectively. After that, the frequency synchronization apparatus uses the moving averagers 3231, 3251 and 3271 to obtain the moving averages of the power of the signals. Meanwhile, the frequency synchronization apparatus uses another power measurement unit 3111 to further measure the power of the input baseband signals. The power especially indicates the signal quality. Another moving averager 3211 is also used to obtain the moving average of the power of the input baseband signals.

The power measurement units 3111, 3131, 3151 and 3171 can be implemented in various ways. The present invention is not limited in the implementation structures of these power measurement units. In order to further clarify the present invention, reference is made to FIGS. 4A-C, which are the possible embodiments of the power measurement unit in the present invention.

Figure 4A:
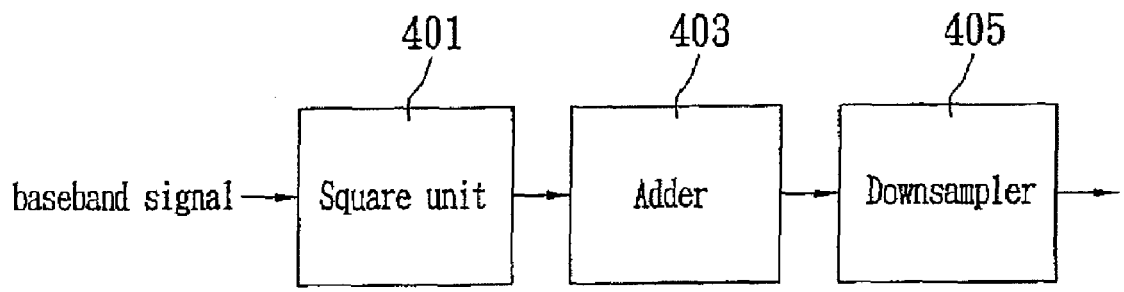
FIGS. 4A-C are internal block diagrams of the preferred embodiments of the power measurement unit in accordance with the present invention.

FIG. 4A is an internal block diagram of the first embodiment of the power measurement unit in accordance with the present invention. The power measurement unit has a square unit 401, an adder 403 and a downsampler 405. The square unit 401 is used to calculate the square values of the input signals. The adder 403 is used to add up two consecutive square values at a time. The downsampler 405 is used to perform a downsampling process for reducing calculation. In this embodiment, every two input signals can be used to provide an instantaneous power estimation value.

Figure 4B:
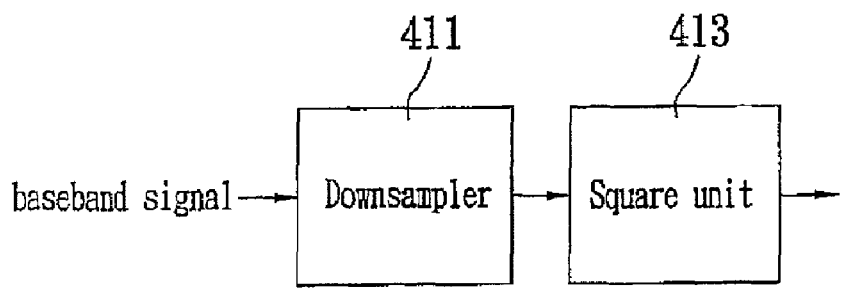

FIG. 4B is an internal block diagram of the second embodiment of the power measurement unit in accordance with the present invention. The power measurement unit has a downsampler 411 and a square unit 413. The downsampler 411 is used to perform a downsampling process for reducing calculation. The square unit 413 is used to calculate the square values of the downsampled signals to provide instantaneous power estimation values.

Figure 4C:
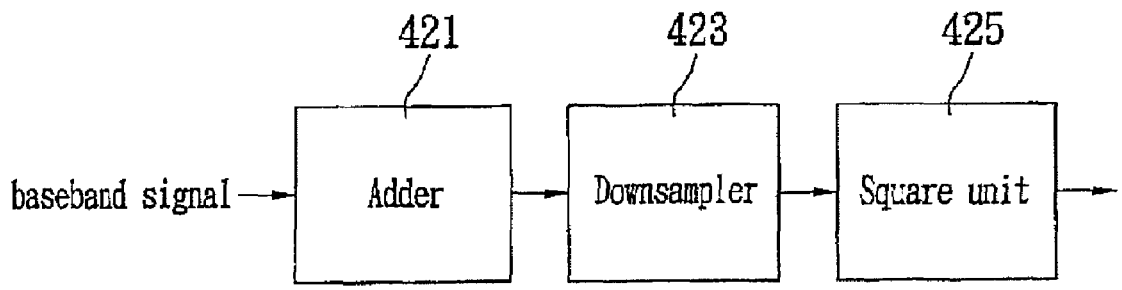

FIG. 4C is an internal block diagram of the third embodiment of the power measurement unit in accordance with the present invention. Therein, the power measurement unit has an adder 421, a downsampler 423 and a square unit 425. The adder 421 is used to add up two consecutive input signals at a time. The downsampler 423 is used to perform a downsampling process for reducing calculation. The square unit 425 is used to calculate the square values of the downsampled signals to provide instantaneous power estimation values.

It should be noted that the implements of the power measurement unit in the present invention are not limited to the designs shown in FIG. 4A-4C.

After obtaining the instantaneous power estimation values and the moving averages, the frequency synchronization apparatus of the present invention employs the maximum signal selector 3301 to find the maximum moving average of quality value by comparison and send it to the power normalizer 3401. Then, the power normalizer 3401 further normalizes the maximum moving average. In this way, the power normalizer 3401 can produce a first detection value $P_n$ for detecting the frequency correction burst, that is the synchronization signal.

Taking a GSM system as an example, various logical channels are used to transmit user data and control signals. The frequency correction channel is one of these logical channels and used to transmit the frequency correction burst for frequency synchronization.

For example, Gaussian minimal shift keying (GMSK) is used in GSM system and all the symbols conveyed in the frequency correction burst are "zeros", and the baseband signal obtained by demodulating the frequency correction burst forms a sinusoidal wave, i.e. the pilot tone, whose frequency is around 66.7 kHz.

In addition, due to the cost, the mobile station, such as cellular phone, of GSM system usually has an imperfect frequency synthesizer. For example, since the frequency synthesizer can be easily affected by temperature, its local frequency may change as the temperature changes. Compared with the carrier frequency of the base station, the local frequency of the mobile station usually has a frequency offset, e.g. 20 kHz. Hence, when the mobile station is activated or performing a hand-over process, it needs to use the frequency correction channel for time and frequency synchronization. However, due to the frequency offset, the baseband frequency of the frequency correction burst demodulated by the mobile station may be shifted from 66.7 kHz.

Here, the present invention uses the pre-filters 3011, 3031 and 3051 with different central frequencies to filter the baseband signal of the demodulated frequency correction burst. Thereby, the present invention can detect the frequency correction burst and the related synchronization signal, and find the frequency offset.

Since all of the pre-filters 3011, 3031 and 3051 have an exclusive pass-band, the present invention can have a wide band detection area including the bands of these pre-filters. If the number of the pre-filters is increased, it can further increase the detection area or improve the detection resolution. Hence, increasing the number of the pre-filters can improve the FCCH detection and frequency correction capabilities. In practice, a designer can increase or reduce the pre-filters according to the cost.

Furthermore, since the center frequency of the pre-filters doesn't need to be changed according to the location or input signals, the present invention doesn't have the problem of time delay or signal missing caused by using adaptive filters.

In practice, the pre-filters 3011, 3031 and 3051 can be infinite impulse response (IIR) or finite impulse response (FIR) filters. In the embodiment of the present invention, the pre-filters 3011, 3031 and 3051 are first-order IIR filters.

Figure 5:
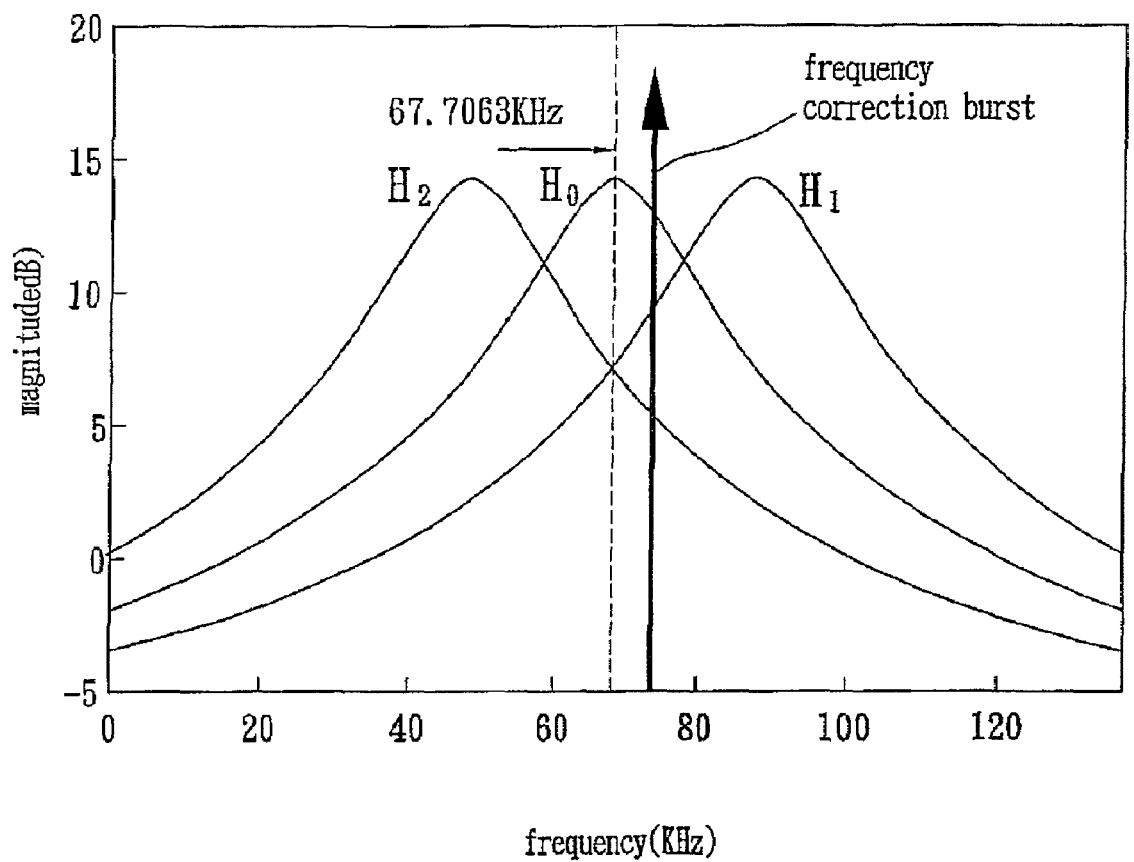
FIG. 5 is a frequency response diagram of the pre-filters in accordance with the present invention.

In order to further clarify the present invention, reference is made to FIG. 5, which is a frequency response diagram of the pre-filters in accordance with the present invention. Therein, the frequency responses of the pre-filters 3011, 3031 and 3051 are designated as $H_0$, $H_1$, and $H_2$, respectively. In this embodiment, the baseband frequency of the demodulated frequency correction burst is assumed to be located mainly inside the pass-band $H_0$ of the pre-filter 3011. (It should be understood that the baseband frequency of the demodulated frequency correction burst may also be located in the pass-band of the pre-filter 3031 or 3051.) The baseband frequency of the demodulated frequency correction burst is represented by an arrow.

It is clear that, in this embodiment, the power of the signal output from the pre-filter 3011 is larger than the output from the pre-filter 3031 or 3051. Hence, after being processed by the power measurement units 3131, 3151, 3171 and the moving averagers 3231, 3251, 3271, the signal output from the moving averager 3231 is selected as the largest signal output by the maximum signal selector 3301.

Furthermore, in order to provide a reference value for the power normalizer 3401 to perform the normalization process, the present invention uses the power measurement unit 3111 to measure the power of the baseband signal directly and uses the moving averager 3211 to calculate its moving average, which is sent to the power normalizer 3401 as the reference value.

Subsequently, by using the reference value, the power normalizer 3401 normalizes the magnitude of the signal output from the moving averager 3231 between 0 and 1 and obtains the first detection value $P_n$. In the present invention, the power normalizer 3401 performs the normalization process via dividing the power average of the signal sent from the moving averager 3231 by the power average of the signal sent from the moving averager 3211. The power average represents the average of the quality values.

Since no pre-filter is used before calculated by the moving averager 3211 (in general, the pre-filter reduces the power of input signals), the average output power of the moving averager 3211 must be larger than that of other moving averagers. Hence, power normalizer 3401 can cause the magnitude of the output signal to be located between 0-1.

In practice, the power normalizer 3401 is not limited to normalizing the magnitude of the output signal to be located between 0 and 1. It only needs to cause the magnitude of the output signal to be located within a fixed range.

In some embodiments, using the power normalizer 3401 can reduce the impact of the fading effect in the wireless channel. Via the normalization process, the first detection value $P_n$ is restricted in a fixed range. Besides, the first detection value $P_n$ will not be affected as the location of the mobile station is changed.

Furthermore, the present invention performs the normalization process via dividing the power average of the signal sent from the moving averager 3231 by the power average of the signal sent from the moving averager 3211. This means that in the normalization process, the present invention doesn't need to use a memory with a great capacity to store the additional lookup table. Hence, compared with the prior art, the present invention can greatly reduce costs.

After obtaining the first detection value $P_n$, the power normalization 3401 passes the value $P_n$ to the signal processor 3501. Then, the signal processor 3501 uses the first detection value $P_n$ to determine whether a frequency correction burst (or the synchronization signal) is transmitted in the FCCH. If the first detection value $P_n$ is larger than a first threshold, the present invention can roughly determine that there is possibility that a frequency correction burst is transmitted in the FCCH. Otherwise, the present invention can determine that no frequency correction burst is transmitted in the FCCH.

In practice, the first threshold is located within 0.75-0.8. However, the present invention is not limited to this range. Besides, the first threshold can be adjusted according to the practical requirements.

When the signal processor 3501 determines that the frequency correction burst is transmitted in the FCCH, it uses the signals output from the maximum signal selector 3301 via the power normalizer 3401 to further calculate the frequency offset.

As shown in FIG. 5, since the baseband frequency of the frequency correction burst is located in the pass-band $H_0$, the signal output from the pre-filter 3011 has the maximum power. Hence, the maximum signal selector 3301 then informs the signal processor 3501 that the signal output from the pre-filter 3011 is the maximum one. Thereby, the signal processor 3501 can be aware that the baseband frequency of the frequency correction burst is located in the pass-band $H_0$. Then, the signal processor 3501 can calculate the difference between the local frequency of the frequency synchronization apparatus and the central frequency of the pre-filter 3011 to obtain the frequency offset.

Figure 3B:
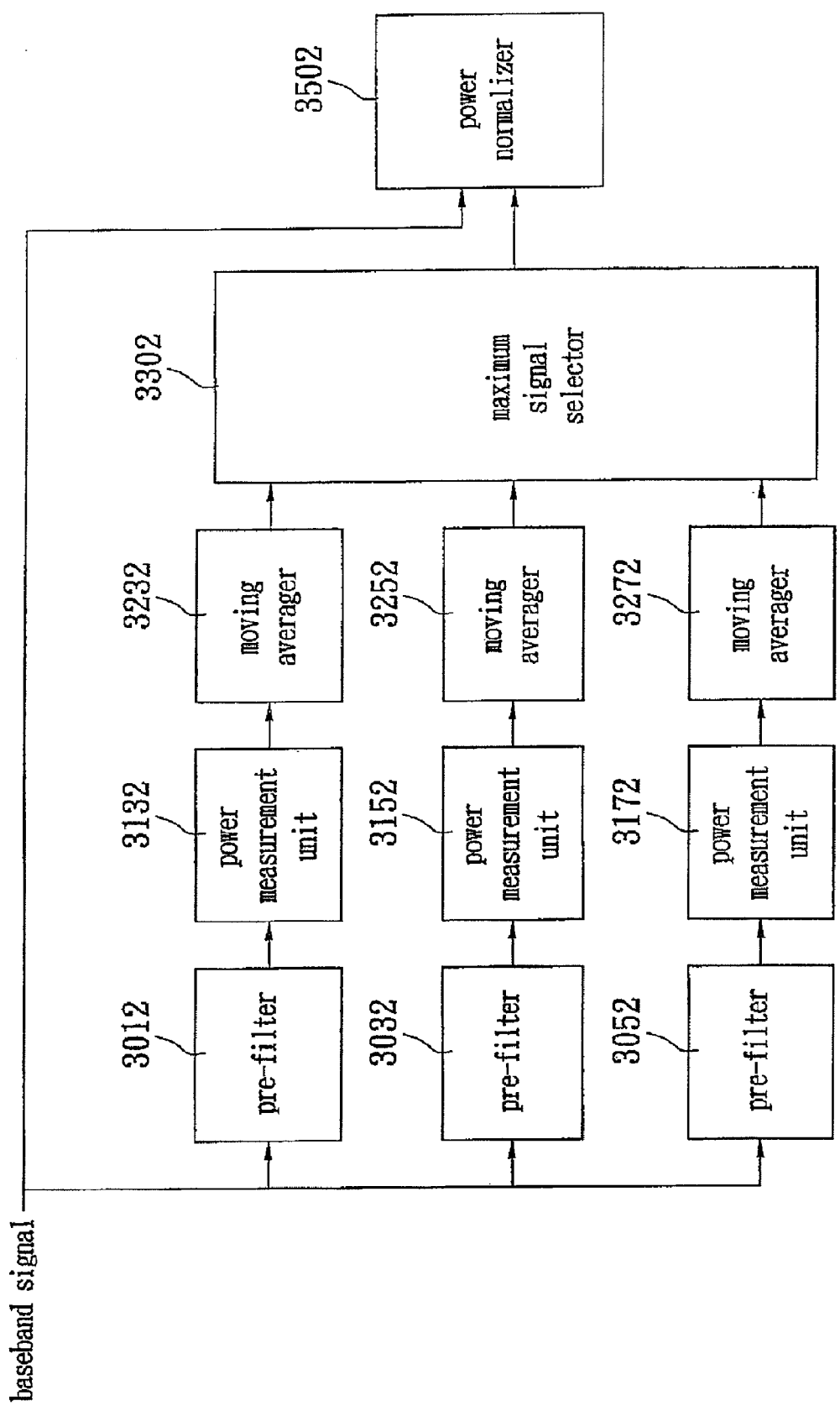

Reference is made to FIG. 3B, which is a block diagram of the second embodiment of the frequency synchronization apparatus in accordance with the present invention. As shown in the figure, the present invention includes pre-filters 3012, 3032, 3052, power measurement units 3132, 3152, 3172, moving averagers 3232, 3252, 3272, a maximum signal selector 3302 and a signal processor 3502.

The components mentioned above, such as the pre-filters 3012, 3032, 3052, the power measurement units 3132, 3152, 3172, the moving averagers 3232, 3252, 3272, and the maximum signal selector 3302, have the same functions as those described in the first embodiment. The main difference between the first and second embodiments is that the signal processor 3502 samples the baseband signal at different time points and then compares these samples. During operation, the signal processor 3502 uses a predetermined mathematical function to calculate a second detection value $Q_n$.

The sample of the baseband signal can be expressed as:

$$r_n = s_n + w_n = \sqrt{V_n} \exp\left(j\left(\frac{n\pi}{2} + n\theta + \varphi\right)\right) + w_n$$

where $w_n$ is the sample of environment noise, $s_n$ is the sample of the original baseband signal, $V_n$ is the received power, $\theta$ is the phase offset of the local oscillator, and $\phi$ is the phase offset caused by the wireless channel.

Figure 6:
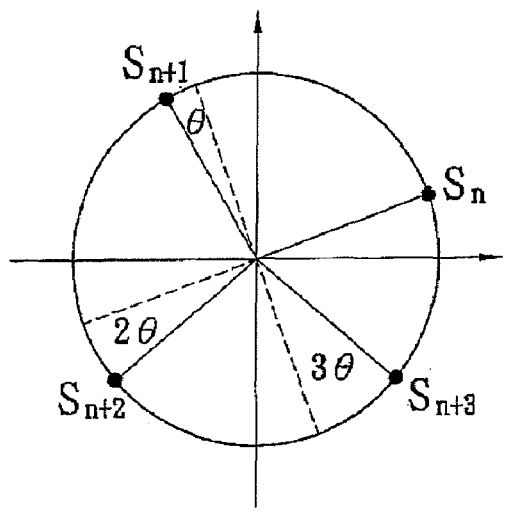
FIG. 6 shows four successive samples of the baseband signal.

FIG. 6 shows four successive samples of the baseband signal. As shown in the figure, it is noted that the difference between the $S_n$ and $S_{n+2}$ or between the $S_{n+1}$ and $S_{n+3}$ is the largest. Hence, to obtain a larger detection value, the predetermined mathematical function of the signal processor 3502 is defined as:

$$A_n = (r_{n+2} - r_n) \times (r_{n+3} - r_{n+1})$$

where "×" is an operation symbol for cross product. It should be noted that the symbols $r_{n \sim n+3}$ could be either sampled from the received baseband signals, from the output of one of the frequency pre-filters, or from the output of the maximum signal selector.

In the present invention, the results obtained by using the predetermined mathematical function are added up and normalized to produce the second detection value $Q_n$. For example, the signal processor 3502 can obtain the summation of the results by one of the following functions:

$$B_n = A_n + A_{n+1}$$

$$S1_n = \sum_{n=1}^{N} (B_n)^k \quad S_1 = \sum_{n=1}^{N} (A_n)^k$$

$$S2_n = \sum_{n=1}^{N} |B_n|^k \quad S_2 = \sum_{n=1}^{N} |A_n|^k$$

where k is an odd number (this embodiment sets k=1 to reduce the calculation), and N is the size of a predetermined moving window, i.e. the total number for adding at a time.

Subsequently, the signal processor 3502 performs a normalization function as follows to produce the second detection value $Q_n$. The second detection value $Q_n$ is also located within 0-1.

$$Q_n = S1_n / S2_n$$

The signal processor 3502 uses the second detection value $Q_n$ to determine whether a frequency correction burst is transmitted in the FCCH. When the second detection value $Q_n$ is larger than a second threshold, the signal processor 3502 determines that a frequency correction burst is transmitted. Otherwise, the signal processor 3502 determines that no frequency correction burst is transmitted.

In general, the second threshold is set within 0.75-0.8. However, the present invention is not limited thereto. The second threshold can be changed according to the practical requirements.

After the signal processor 3502 determines that a frequency correction burst is transmitted, it uses the signal output from the maximum signal selector 3302 to calculate the frequency offset. For example, if the baseband frequency of the frequency correction burst is located in the pass-band $H_0$ as shown in FIG. 5, the signal output from the pre-filter 3012 has the maximum power. Hence, the maximum signal selector 3302 sends a signal to inform the signal processor 3502 that the signal output from the pre-filter 3012 is the maximum. Thereby, the signal processor 3502 can be aware that the baseband frequency of the frequency correction burst is located in the pass-band of the pre-filter 3012. Then, the signal processor 3502 calculates the difference between the local frequency of the frequency synchronization apparatus and the central frequency of the pre-filter 3012 to obtain the frequency offset.

Figure 3C:
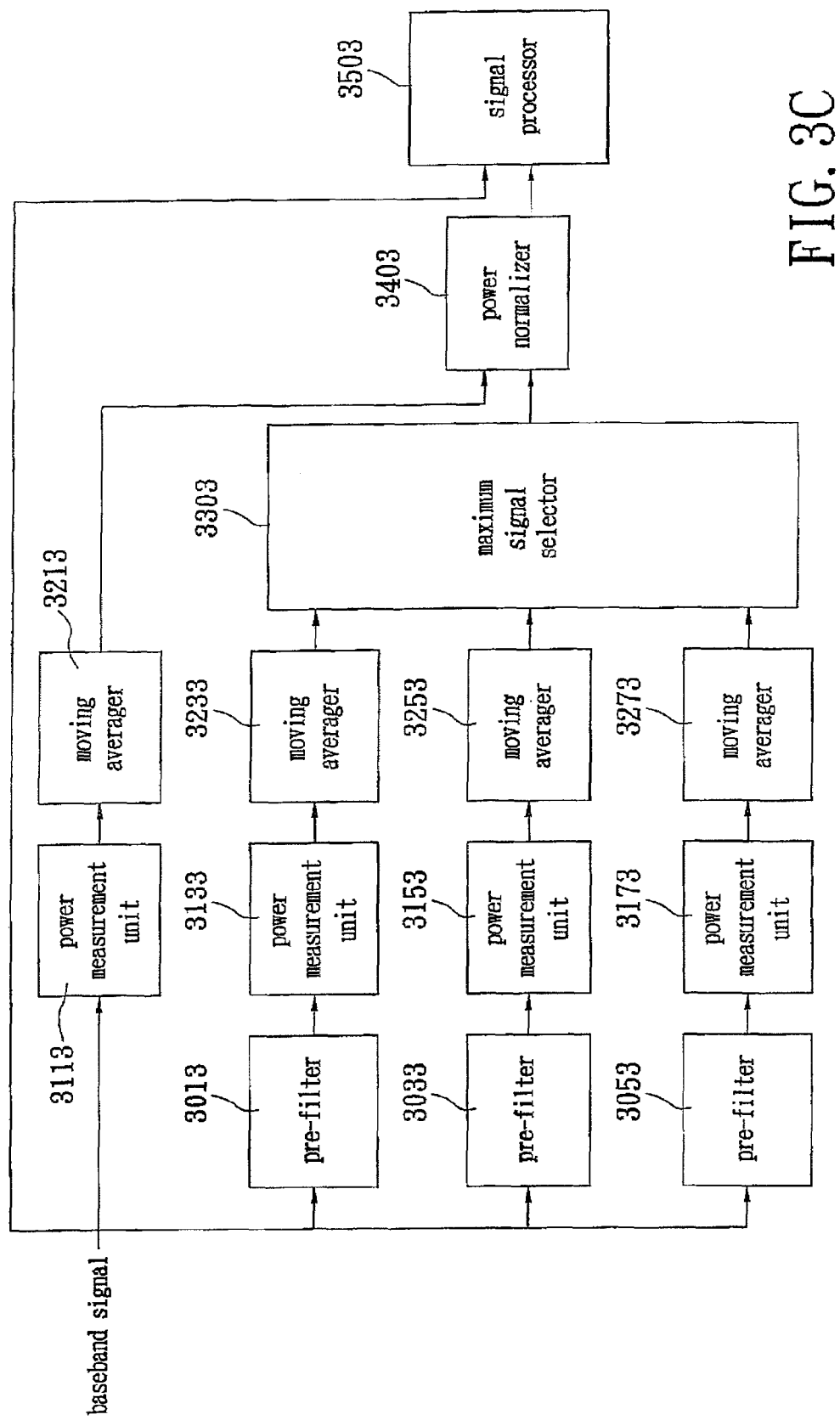

Reference is made to FIG. 3C, which is a block diagram of the third embodiment of the frequency synchronization apparatus in accordance with the present invention. As shown in the figure, the present invention includes pre-filters 3013, 3033, 3053, power measurement units 3113, 3133, 3153, 3173, moving averagers 3213, 3233, 3253, 3273, a maximum signal selector 3303, a power normalizer 3403 and a signal processor 3503.

Since the components mentioned above, such as the pre-filters 3013, 3033, 3053, the power measurement units 3113, 3133, 3153, 3173, the moving averagers 3213, 3233, 3253, 3273, the maximum signal selector 3303 and the power normalizer 3403, have the same functions as those described in the first embodiment.

Similar to the first embodiment, the maximum signal selector 3303 is used to compare the average powers of the signals sent from the moving averagers 3233, 3253 and 3273 to find the signal with the maximum power and pass it to the power normalizer 3403. Then, the power normalizer 3403 performs a normalization process and produces the first detection value $P_n$. Therein, the present invention can determine whether a frequency correction burst is transmitted in the FCCH according to the first detection value $P_n$.

After obtaining the first detection value $P_n$, the power normalization 3403 passes it to the signal processor 3503. Then, the signal processor 3503 uses the first detection value $P_n$ to determine whether a frequency correction burst is transmitted in the FCCH. If the first detection value $P_n$ is larger than the first threshold, the present invention determines that there is possibility that a frequency correction burst is transmitted in the FCCH. Otherwise, the present invention determines that no frequency correction burst is transmitted in the FCCH.

Similar to the second embodiment, the signal processor 3503 is used to sample the baseband signal at different time points and compares these samples. The signal processor 3503 uses a predetermined mathematical function to produce the second detection value $Q_n$. The present invention can use the second detection value $Q_n$ to ascertain whether a frequency correction burst is transmitted in the FCCH. If the second detection value $Q_n$ is larger than a second threshold, it ascertains that a frequency correction burst is transmitted. Otherwise, it ascertains that no frequency correction burst is transmitted.

In this embodiment, the signal processor 3503 can use the first detection value $P_n$ or the second detection value $Q_n$ singly or together to determine whether a frequency correction burst is transmitted in the FCCH. When the first detection value $P_n$ or the second detection value $Q_n$ is larger than the first threshold or the second threshold, the present invention can determine that a frequency correction burst has been transmitted in the FCCH. At this moment, the signal processor 3503 can find the baseband location of the frequency correction burst according to the information provided by the maximum signal selector 3303, i.e. the information about the pre-filter having an output signal with the maximum power.

In the third embodiment, the signal processor 3503 uses the first detection value $P_n$ together with the second detection value $Q_n$ to determine whether a frequency correction burst is transmitted in the FCCH. The signal processor 3503 can define a third detection value $R_n$ as follows to combine the first detection value $P_n$ with the second detection value $Q_n$:

$$R_n = \lambda \cdot Q_n + (1-\lambda) \cdot P_n$$

where $\lambda$ is set between 0-1 according to the practical requirements. Thereby, the third detection value $R_n$ is also located between 0 and 1.

Since the first detection value $P_n$ is derived from the powers of the signals, it is insensitive to the phase offset. However, the baseband signal needs to be processed by the pre-filters in advance and then the calculation for the first detection value $P_n$ is performed. This causes part of the power to be lost in the filtering process. Hence, in general, the peak value of the first detection value $P_n$ is lower than that of the second detection value $Q_n$.

Furthermore, the second detection value $Q_n$ is derived from the samples of the baseband signal at different time points, and it is sensitive to the phase offset. However, since the signal processor directly uses the samples of the baseband signal to calculate the second detection value $Q_n$, the detection value $Q_n$ have a higher peak value.

Therefore, by combining the combine the first detection value $P_n$ with the second detection value $Q_n$, the present invention minimizes the instability caused by the power loss and phase offsets. It should be noted that $R_n = P_n$ as $\lambda = 0$ and $R_n = Q_n$ as $\lambda = 1$.

Figure 7:
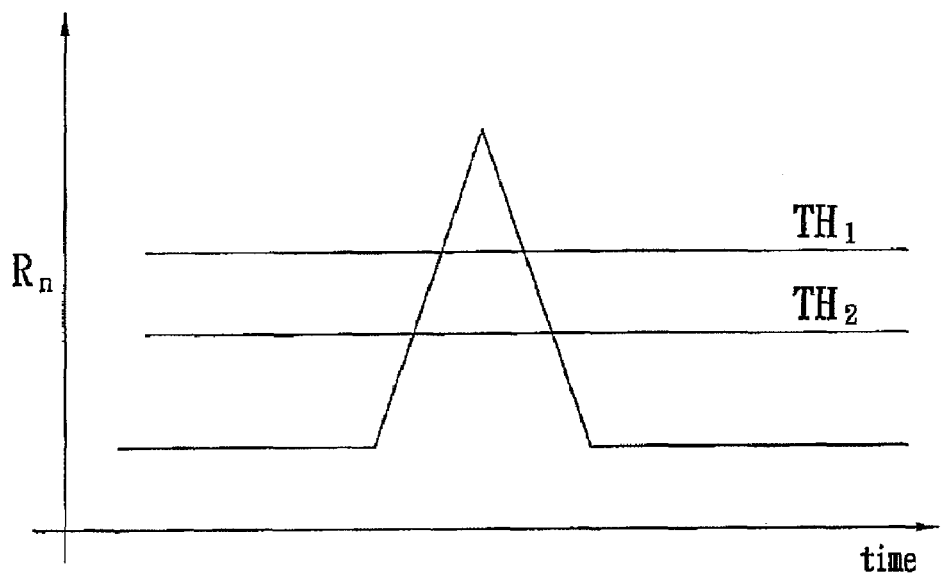
FIG. 7 is a schematic diagram of the third detection value versus time.

Reference is made to FIG. 7, which is a schematic diagram of the third detection value versus time. Therein, the horizontal axis represents time and the vertical axis represents the magnitude of the third detection value $R_n$. The first and second thresholds are designated as $TH_1$ and $TH_2$, respectively. As shown in the figure, at the beginning of receiving the frequency correction burst, the third detection value $R_n$ increases with time. On the contrary, at the end of receiving the frequency correction burst, the third detection value $R_n$ decreases with time.

This is because the first detection value $P_n$ is derived from the power summation of the received signal and the second detection value $R_n$ is derived from the summation of the results obtained by using the mathematical function of the signal processor. At the beginning of receiving the frequency correction burst, the received portion of the burst is gradually increased. Hence, the third detection value $R_n$ is increased. However, at the end of receiving the frequency correction burst, the received portion of the burst is gradually decreased. Hence, the third detection value $R_n$ is decreased.

Based on the variation of the third detection value $R_n$, the present invention can detect the frequency correction burst. When the first detection value $P_n$ exceeds the first threshold, the present invention preliminary determines that a frequency correction burst is received. And, when the third detection value $R_n$ exceeds the second threshold and the third detection value $R_n$ is rising and then falling for more than M consecutive symbols, the present invention confirms that a frequency correction burst is received.

In this embodiment, the first threshold is 0.75 and the second threshold is 0.8. However, the present invention is not limited thereto. The first and second thresholds can be changed according to practical requirements. The only limitation is that the second threshold be larger than the first threshold.

When the frequency synchronization apparatus confirms that the frequency correction burst has been received, it can find the pre-filter that outputs the signal with maximum power. Thereby, the frequency synchronization apparatus can calculate the frequency offset of itself. Furthermore, by observing variation of the third detection value $R_n$, the frequency synchronization apparatus can also use the occurrence time of the peak value of the third detection value $R_n$ to calculate its time offset.

Therefore, when the signal processor 3503 determines that the frequency correction burst is received, it uses the signal sent from the maximum signal selector 3303 via the power normalizer 3403 to calculate the frequency offset.

As shown in FIG. 5, since the baseband frequency of the frequency correction burst is located in the pass-band $H_0$, the signal output from the pre-filter 3013 has the maximum power. Hence, the maximum signal selector 3303 sends a signal to inform the signal processor 3503 that the signal output from the pre-filter 3013 is the maximum one. Thereby, the signal processor 3503 can be aware that the baseband frequency of the frequency correction burst is located in the pass-band of the pre-filter 3013. Then, the signal processor 3503 can calculate the difference between the local frequency of the frequency synchronization apparatus and the central frequency of the pre-filter 3013 to obtain the frequency offset.

Figure 8A:
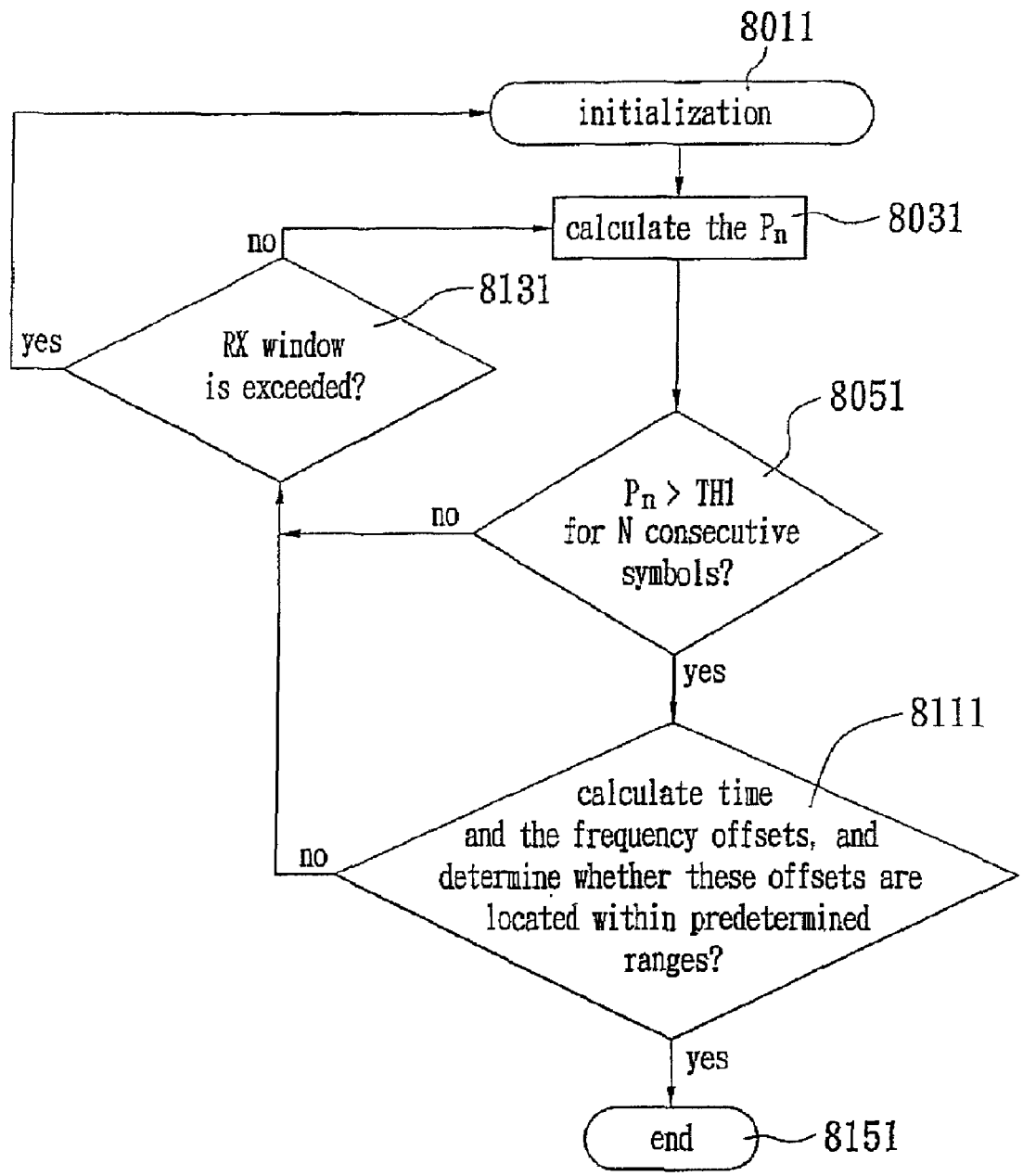
FIGS. 8A-C are flowcharts of the preferred embodiments of the frequency synchronization method in accordance with the present invention.

In order to further clarify the present invention, reference is made to FIG. 8A, which is a flowchart of the first preferred embodiment of the frequency synchronization method in accordance with the present invention. It includes:

Step 8011: performing an initialization process;

Step 8031: calculating the first detection value $P_n$;

Step 8051: determining whether there are N consecutive symbols that make the first detection value $P_n$ larger than the first threshold $TH_1$; If yes, perform step 8111; otherwise, jump to step 8131;

Step 8111: calculating the time offset and the frequency offset, and determining whether these offsets are located within predetermined ranges; if yes, go to step 8151; otherwise, jump to step 8131;

Step 8131: determining whether the RX window is exceeded; if yes, go to step 8011; otherwise, perform step 8031; and Step 8151: ending the process.

Figure 9:
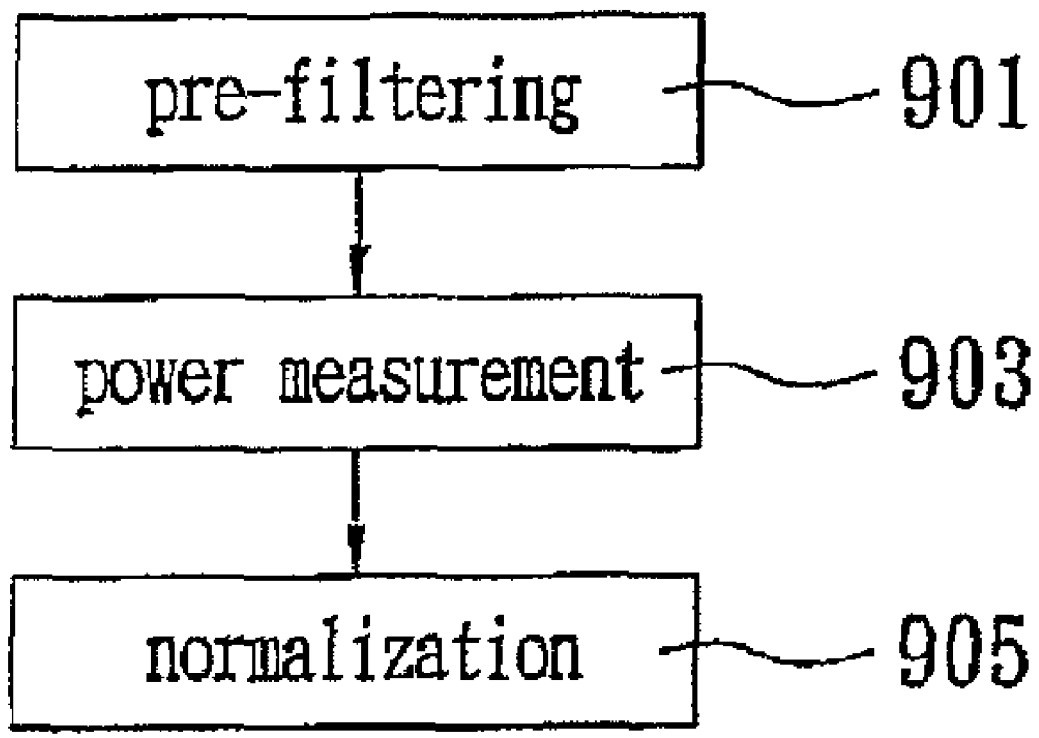
FIG. 9 is a flowchart for illustrating the calculation of the first detection value.

Therein, as shown in FIG. 9, the step 8031 further includes:

Step 901: using multiple pre-filters to filter the baseband signal of the frequency correction burst;

Step 902: using a first power measurement unit to measure the power of the baseband signal to form a first power value, and using multiple second power measurement units to measure the powers of the signals output from the pre-filters respectively to form multiple second power values; therein, the number of the second power measurement units is the same as that of the pre-filters and the second power measurement units is one-to-one matched to the pre-filters; and Step 903: using a first moving averager to calculate the average value of the first power values to produce the first power average, and using multiple second moving averagers to calculate the average values of the second power values respectively; using the maximum signal selector to find the largest one of the average values output from the second moving averagers to produce the second power average; and using a power normalizer to divide the second power average by the first power average to perform the normalization process and thereby produce the first detection value $P_n$; therein, the number of the second moving averagers is the same as that of the second power measurement units and the second moving averagers are one-to-one matched to the second power measurement units.

Figure 8B:
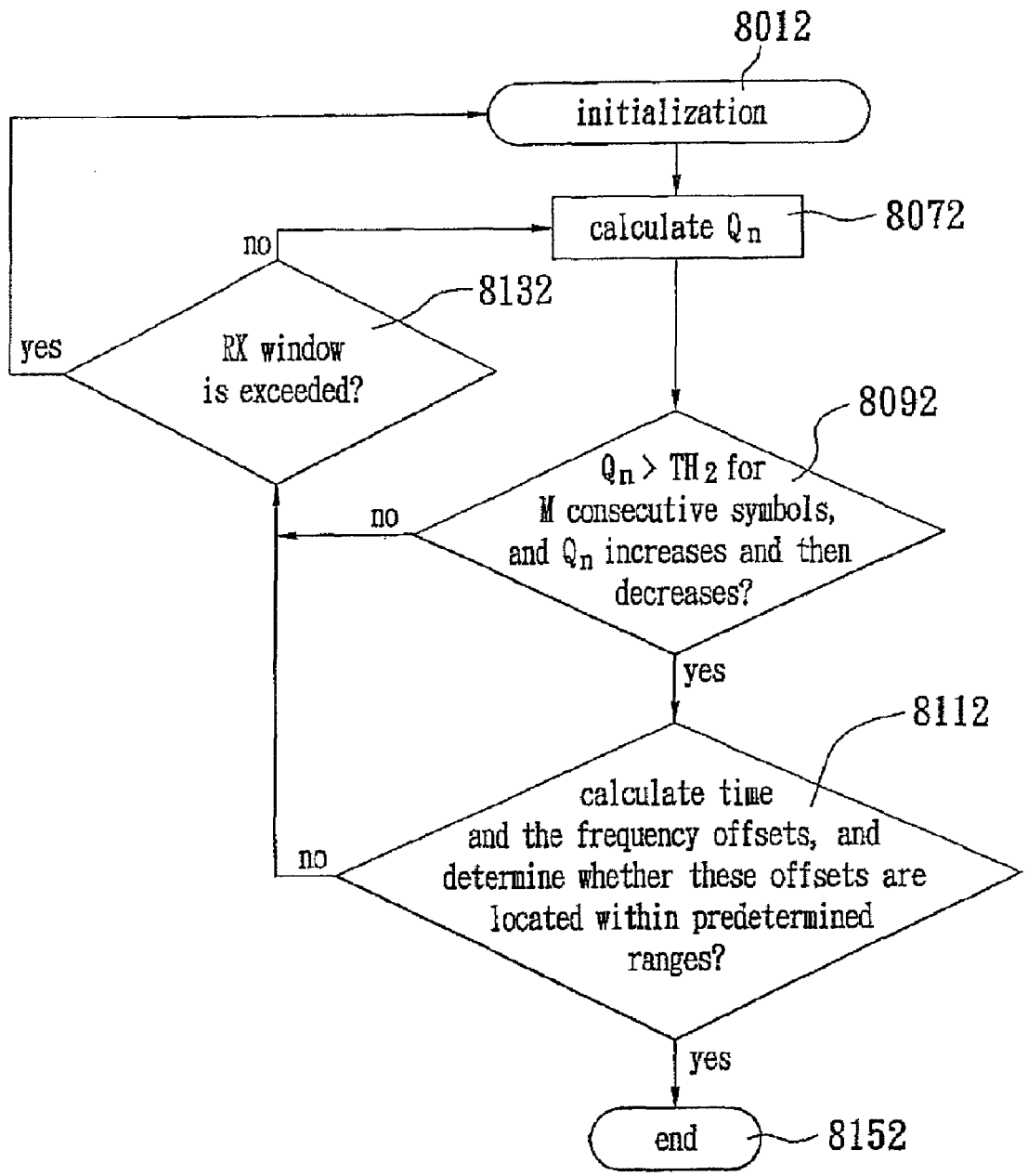

In order to further clarify the present invention, reference is made to FIG. 8B, which is a flowchart of the second preferred embodiment of the frequency synchronization method in accordance with the present invention. It includes:

Step 8012: performing an initialization process;

Step 8072: calculating the second detection value $Q_n$ as mentioned above;

Step 8092: determining whether there are M consecutive symbols that make second detection value $Q_n$ larger than the second threshold $TH_2$; If yes, perform step 8112; otherwise, jump to step 8132;

Step 8112: calculating the time offset and the frequency offset, and determining whether these offsets are located within predetermined ranges; if yes, go to step 8152; otherwise, jump to step 8132;

Step 8132: determining whether the RX window is exceeded; if yes, go to step 8012; otherwise, perform step 8072; and Step 8152: ending the process.

Figure 8C:
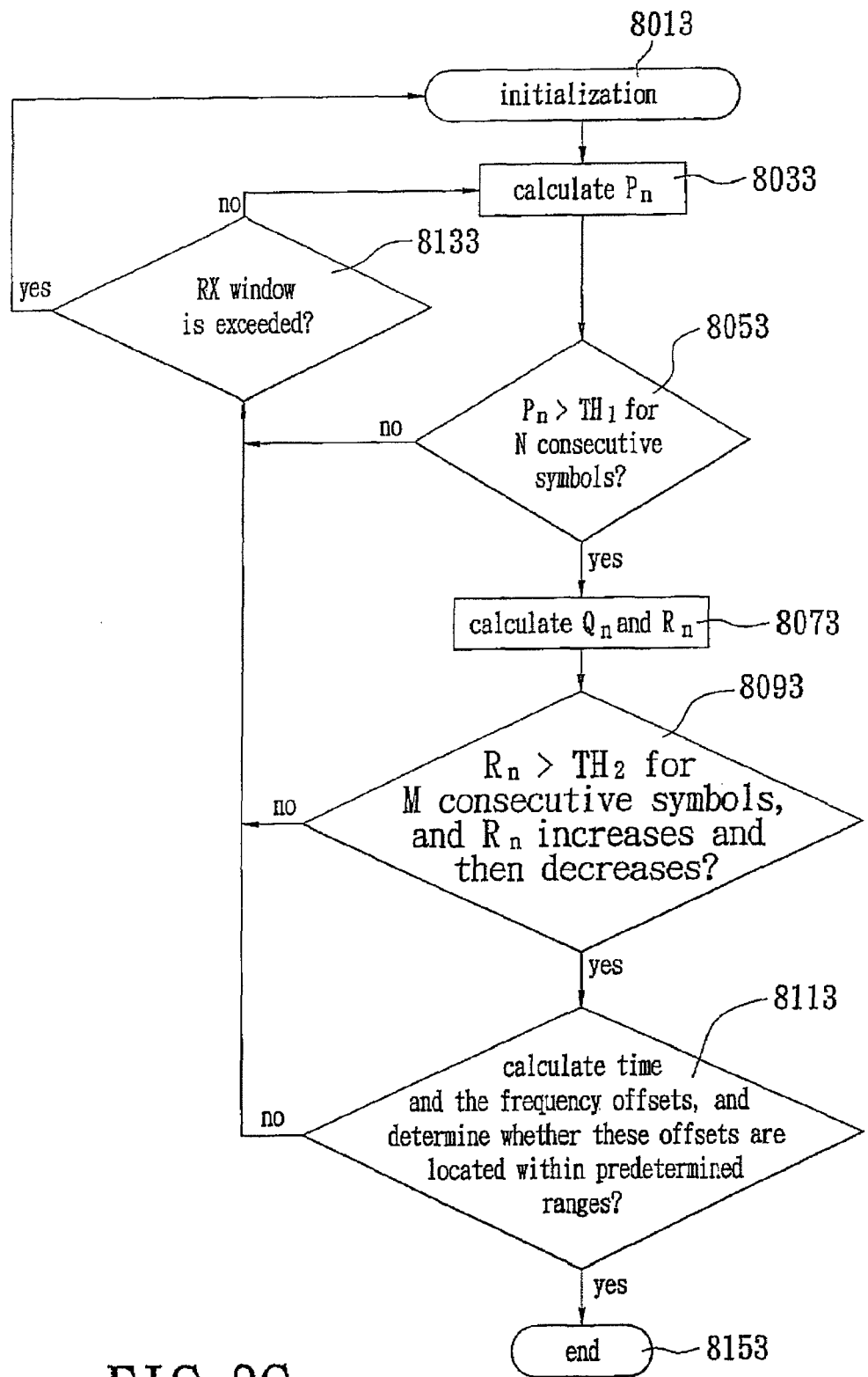

In order to further clarify the present invention, reference is made to FIG. 8C, which is a flowchart of the third preferred embodiment of the frequency synchronization method in accordance with the present invention. It includes:

Step 8013: performing an initialization process;

Step 8033: calculating the first detection value $P_n$;

Step 8053: determining whether there are N consecutive symbols that make the first detection value $P_n$ larger than the first threshold $TH_1$; If yes, perform step 8073; otherwise, jump to step 8133;

Step 8073: calculating the second detection value Q, and combing the first detection value $P_n$ with the second detection value $Q_n$ to produce the third detection value $R_n$ as mentioned above;

Step 8093: determining whether there are M consecutive symbols that make the third detection value $R_n$ larger than the second threshold $TH_2$, in which the third detection value $R_n$ is increased first and then decreased; if yes, perform step 8113; otherwise, jump to step 8133;

Step 8113: calculating the time offset and the frequency offset, and determining whether these offsets are located within predetermined ranges; if yes, go to step 8153; otherwise, jump to step 8133;

Step 8133: determining whether the RX window is exceeded; if yes, go to step 8053; otherwise, perform step 8133; and Step 8153: ending the process.

Likewise, step 8033 also has the steps shown in FIG. 9 and these steps are not described again.

Summing up, the present invention has following features and advantages:

(1) In the normalization process, the present invention doesn't need to use a memory unit with a large capacity to store an additional lookup table. Hence, compared to the prior art, the present invention can greatly reduce the cost.

(2) In the present invention, the pre-filters do not need to be adjusted dynamically as the location or the received signal is changed. Hence, compared to the prior art using adaptive filters, the present invention doesn't have the problem of time delay or missing signal.

Although the present invention has been described with reference to the preferred embodiment thereof, it will be understood that the invention is not limited to the details thereof. Various substitutions and modifications have been suggested in the foregoing description, and other will occur to those of ordinary skill in the art. Therefore, all such substitutions and modifications are embraced within the scope of the invention as defined in the appended claims.

What is claimed is:

1. A frequency synchronization apparatus for detecting a synchronization signal from a plurality of baseband signals, comprising:

at least one signal power generator, for receiving a predetermined number of symbols of the baseband signals and respectively calculating an average quality value of the received symbols;

a signal selector, connected to the signal power generator, for producing a first detection value according to the average quality value; and a decision unit, connected to the signal selector, including a signal processor for producing a second detection value by using a predetermined mathematical function;

wherein the signal processor calculates a third detection value as combining the first detection value and the second detection, and the relation of the detection values are described as:

$$R_n = \lambda \cdot Q_n + (1-\lambda) \cdot P_n$$

wherein $P_n$ represents the first detection value, $Q_n$ represents the second detection value, $R_n$ represents the third detection value, and $\lambda$ represents a value selected from 0, 1, or a fraction number between 0 and 1;

whereby, the decision unit decides whether the synchronization signal is received or not in reference with the third detection value.

2. The apparatus of claim 1, wherein the one signal power generator further includes:

a pre-filter, for filtering the received symbols;

a power measurement unit, connected to the pre-filter, for measuring power of the filtered symbols; and a moving averager, connected to the power measurement unit, for obtaining the average quality value.

3. The apparatus of claim 2, wherein the power measurement unit comprising:

a square unit, connected to the pre-filter, for calculating square values of the filtered symbols;

an adder, connected to the square unit, for adding up every two consecutive square values; and a downsampler, connected to the adder, for performing a downsampling action to obtain the quality value.

4. The apparatus of claim 2, wherein the power measurement unit comprising:

an adder, connected to the pre-filter, for adding up every two consecutive filtered symbols;

a downsampler, connected to the adder, for performing a downsampling action of the added symbols; and a square unit, connected to the downsampler, for calculating square values of the downsampled symbols to obtain the quality value.

5. The apparatus of claim 2, wherein the power measurement unit further comprising:

a downsampler, connected to the pre-filter, for performing a downsampling action on the filtered symbols; and a square unit, connected to the downsampler, for calculating square values of the downsampled symbols to obtain the quality value.

6. The apparatus of claim 2, wherein each pre-filter has a specific frequency pass-band.

7. The apparatus of claim 2, wherein the pre-filter is an infinite impulse response (IIR) filter or a finite impulse response (FIR) filter.

8. The apparatus of claim 7, wherein the pre-filter is a first-order IIR filter.

9. The apparatus of claim 2, wherein the symbols are sampled from the received baseband signals from output of one of the frequency pre-filters.

10. The apparatus of claim 2, wherein the symbols are sampled from the received baseband signals from output of the signal selector.

11. The apparatus of claim 1, wherein the predetermined mathematical function of the signal processor is defined as:

$$A_n = (r_{n+2} - r_n) \times (r_{n+3} - r_{n+1})$$

where $r_{n\sim n+3}$ represents symbols at different time points, $A_n$ represents a calculation result, and "×" is an operation symbol for a cross product.

12. The apparatus of claim 11, wherein the symbols represented by $r_{n\sim n+3}$ are sampled from the received baseband signals.

13. The apparatus of claim 11, wherein the symbols represented by $r_{n\sim n+3}$ are sampled from the output of one or more pre-filters included in the signal power generator.

14. The apparatus of claim 11, wherein the symbols represented by $r_{n\sim n+3}$ are sampled from the output of the signal selector.

15. The apparatus of claim 1, further comprising:
a power normalizer, connected to the signal selector, for normalizing the average quality value by a reference to obtain the first detection value.

16. The apparatus of claim 15, further comprising:
a reference power generator, connected to the power normalizer, for measuring the quality value of the received symbols prior to filtering.

17. The apparatus of claim 1, wherein the signal processor compares the second detection value with a second threshold to confirm whether the synchronization signal is received.

18. The apparatus of claim 1, wherein the signal processor compares the third detection value with a third threshold to confirm whether the synchronization signal is received.

19. The apparatus of claim 18, wherein the signal processor further determines whether the third detection value exceeds the second threshold or not and whether the third detection value rises and then falls for more than M consecutive symbols to confirm that a synchronization signal is received.

20. A wireless communication system applying the frequency synchronization apparatus of claim 1.

* * * * *